(12) United States Patent
Kitai et al.

(10) Patent No.: US 10,903,374 B2
(45) Date of Patent: Jan. 26, 2021

(54) SCHOTTKY SEMICONDUCTOR DEVICE WITH JUNCTION TERMINATION EXTENSIONS

(71) Applicant: SUMITOMO ELECTRIC INDUSTRIES, LTD., Osaka (JP)

(72) Inventors: Hidenori Kitai, Ibaraki (JP); Hiromu Shiomi, Ibaraki (JP); Kenji Fukuda, Ibaraki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 5 days.

(21) Appl. No.: 16/482,437

(22) PCT Filed: Nov. 13, 2017

(86) PCT No.: PCT/JP2017/040767
§ 371 (c)(1),
(2) Date: Jul. 31, 2019

(87) PCT Pub. No.: WO2018/168069
PCT Pub. Date: Sep. 20, 2018

(65) Prior Publication Data
US 2020/0251600 A1 Aug. 6, 2020

(30) Foreign Application Priority Data
Mar. 15, 2017 (JP) .................. 2017-050319

(51) Int. Cl.
*H01L 29/872* (2006.01)
*H01L 29/06* (2006.01)
*H01L 29/16* (2006.01)

(52) U.S. Cl.
CPC ........ *H01L 29/872* (2013.01); *H01L 29/0623* (2013.01); *H01L 29/0638* (2013.01); *H01L 29/1608* (2013.01)

(58) Field of Classification Search
CPC ....................................................... H01L 29/872
(Continued)

(56) References Cited

U.S. PATENT DOCUMENTS

| 2003/0183900 A1* | 10/2003 | Barthelmess | ......... H01L 29/405 |
| | | | 257/500 |
| 2012/0205666 A1* | 8/2012 | Henning | ............. H01L 29/0619 |
| | | | 257/77 |

(Continued)

FOREIGN PATENT DOCUMENTS

| JP | 2000-516767 | 12/2000 |
| JP | 2006-165225 | 6/2006 |

(Continued)

*Primary Examiner* — Ajay Arora
(74) *Attorney, Agent, or Firm* — IPUSA, PLLC

(57) ABSTRACT

A semiconductor device includes a first JTE region formed around an active portion, a second JTE region formed around the first JTE region, and a third JTE region formed around the second JTE region. The first, second, and third JTE regions are doped with an impurity of a second conductivity type different from a first conductivity type. A concentration ratio R21 "(concentration of impurity in second JTE region)/(concentration of impurity in first JTE region)" and a concentration ratio R32 "(concentration of impurity in third JTE region)/(concentration of impurity in second JTE region)" are 0.50 or greater and 0.65 or less. A width W1 of the first JTE region, a width W2 of the second JTE region, and a width W3 of the third JTE region are 130 μm or greater and 190 μm or less.

8 Claims, 7 Drawing Sheets

(58) Field of Classification Search
USPC .......................................................... 257/77
See application file for complete search history.

(56) References Cited

U.S. PATENT DOCUMENTS

2016/0315187 A1   10/2016   Kinoshita et al.
2017/0084701 A1   3/2017    Kitamura

FOREIGN PATENT DOCUMENTS

| JP | 2014-175377 | 9/2014 | |
|----|-------------|--------|---|
| WO | 98/02924 | 1/1998 | |
| WO | 2016/013472 | 1/2016 | |
| WO | WO-2016013472 A1 * | 1/2016 | ........... H01L 21/761 |
| WO | 2016/103814 | 6/2016 | |
| WO | WO-2016103814 A1 * | 6/2016 | ............. H01L 29/36 |

* cited by examiner

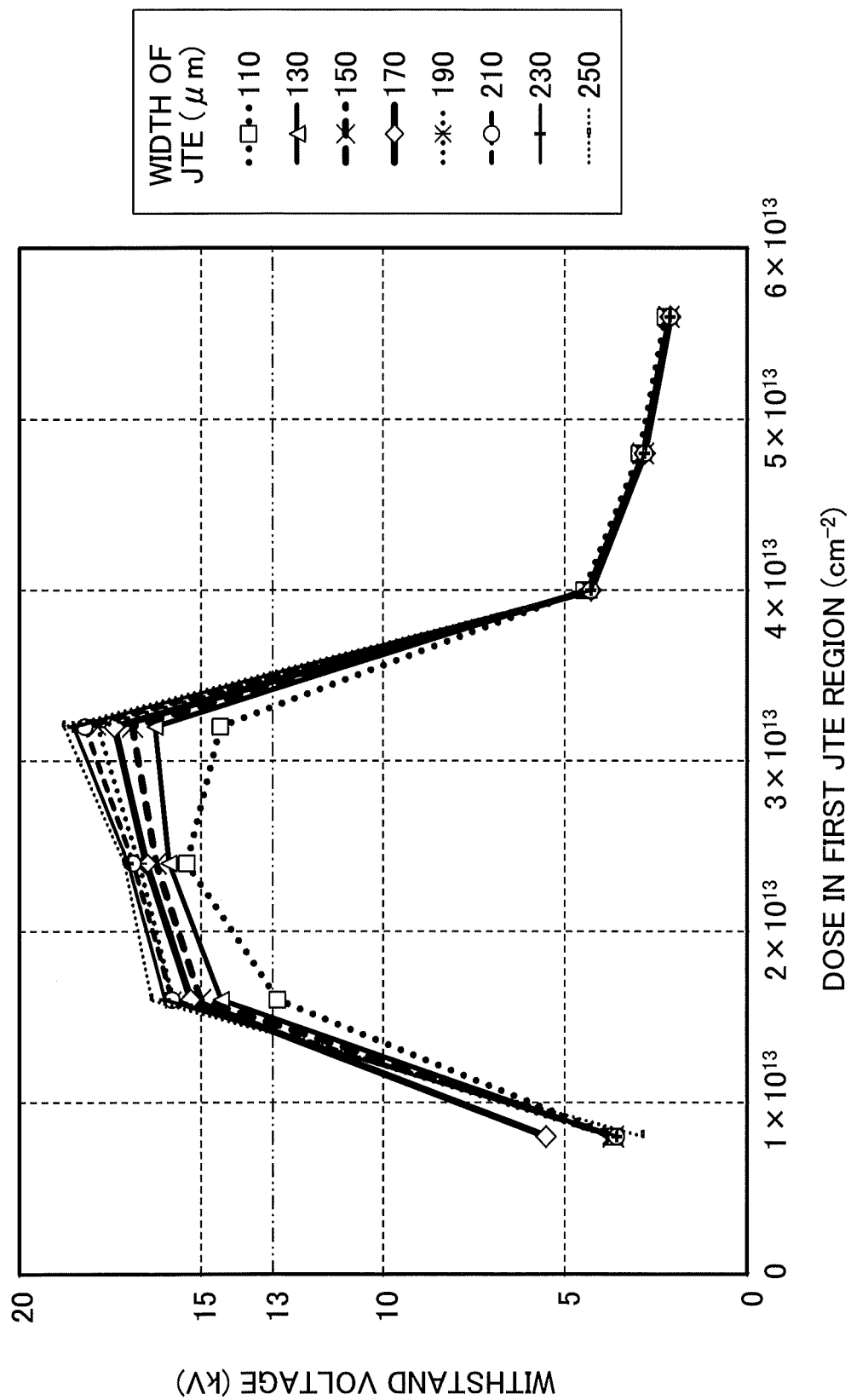

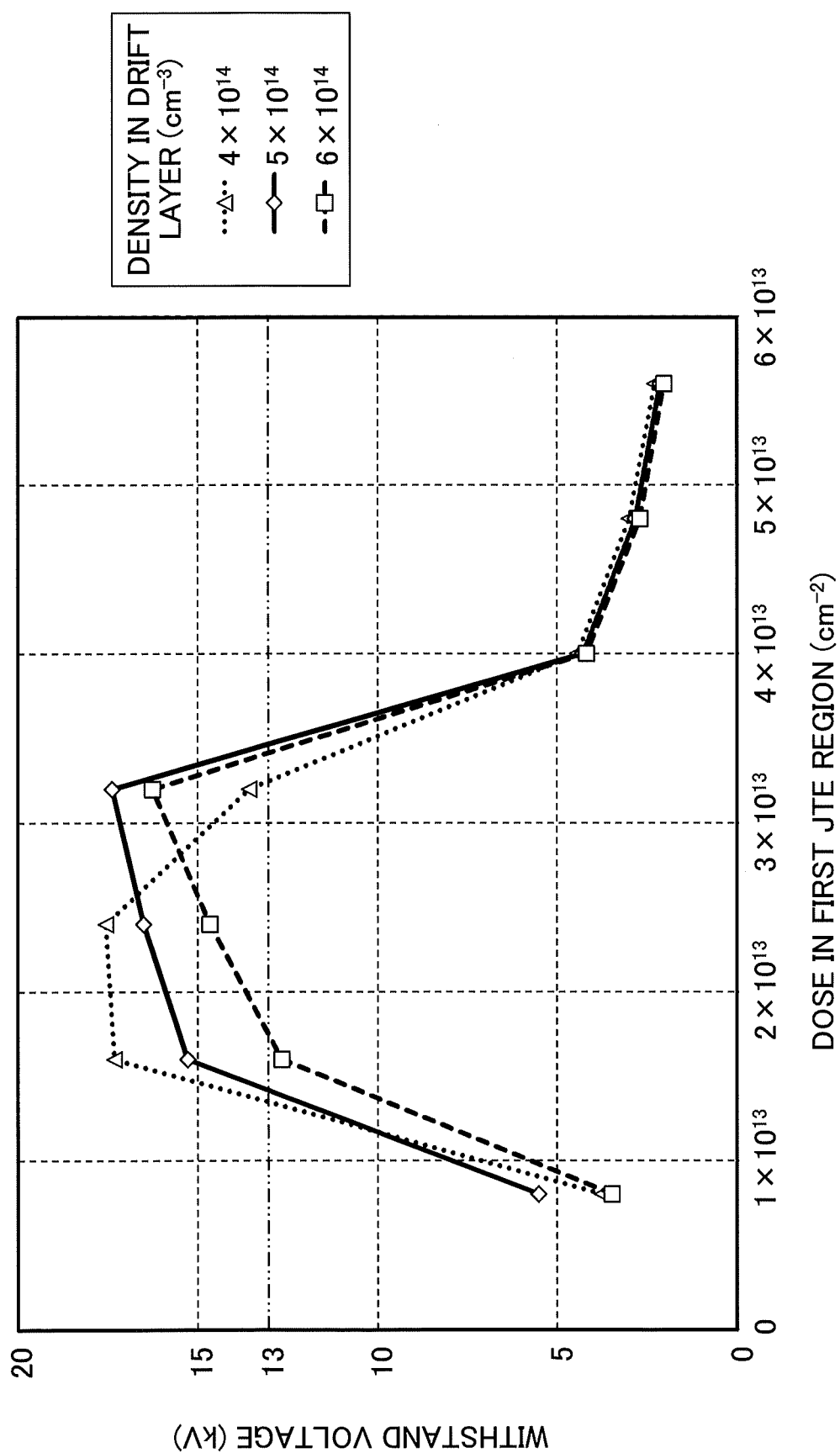

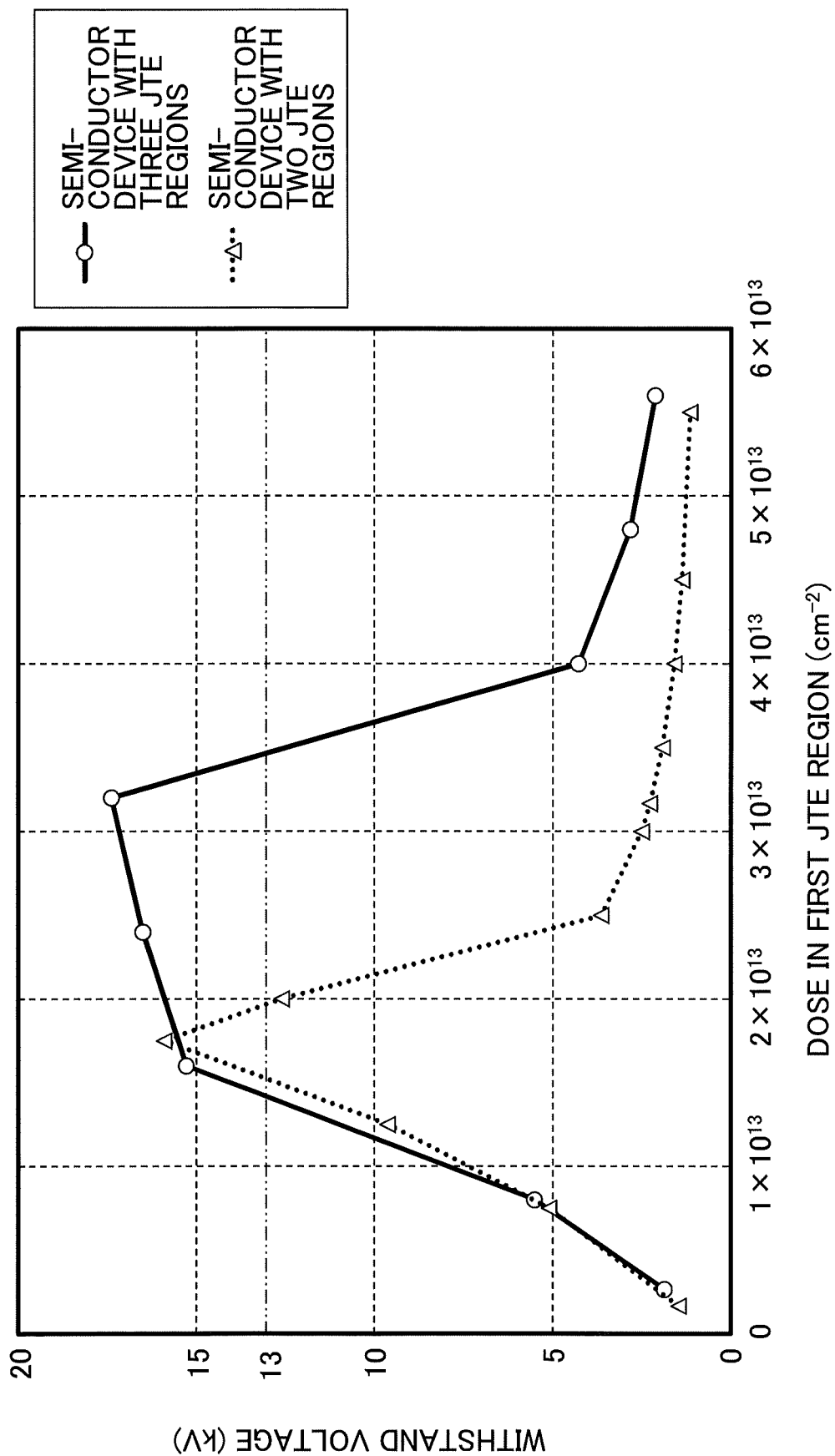

SCHOTTKY SEMICONDUCTOR DEVICE WITH JUNCTION TERMINATION EXTENSIONS

TECHNICAL FIELD

This disclosure relates to a semiconductor device.

The present application is based upon and claims priority to Japanese Patent Application No. 2017-050319, filed on Mar. 15, 2017, the entire contents of which are incorporated herein by reference.

BACKGROUND ART

A semiconductor device using silicon carbide (SiC) is known as a device with excellent temperature and withstand voltage characteristics. For example, in a Schottky barrier diode using SiC, a peak of an electric field (electric field concentration) occurs near the outer edge of a Schottky electrode. Therefore, there is a Schottky barrier diode where a termination structure is provided around an active region through which an electric current flows to reduce the electric field concentration. As an example of such a termination structure, a Junction Termination Extension (JTE) structure where a p-type region is formed around the periphery of the Schottky electrode is known.

RELATED ART DOCUMENTS

Patent Documents

[Patent Document 1] Japanese Laid-Open Patent Publication No. 2006-165225
[Patent Document 2] Japanese Laid-Open Patent Publication No. 2000-516767

DISCLOSURE OF INVENTION

According to an aspect of the embodiment, a semiconductor device includes a single-crystal silicon carbide substrate of a first conductivity type, a drift layer of the first conductivity type which is formed of a silicon carbide film on one surface of the single-crystal silicon carbide substrate, and one electrode that is Schottky-connected to the drift layer. The semiconductor device also includes a first JTE region that is formed around an active portion where the drift layer and the one electrode are Schottky-connected, a second JTE region that is formed around the first JTE region, a third JTE region that is formed around the second JTE region, and another electrode that is disposed on another surface of the single-crystal silicon carbide substrate. The first JTE region, the second JTE region, and the third JTE region are doped with an impurity of a second conductivity type different from the first conductivity type. A concentration ratio R21 represented by (concentration of the impurity in the second JTE region)/(concentration of the impurity in the first JTE region) and a concentration ratio R32 represented by (concentration of the impurity in the third JTE region)/(concentration of the impurity in the second JTE region) are greater than or equal to 0.50 and less than or equal to 0.65. A width W1 of the first JTE region, a width W2 of the second JTE region, and a width W3 of the third JTE region are greater than or equal to 130 μm and less than or equal to 190 μm.

BRIEF DESCRIPTION OF THE DRAWINGS

FIG. 3 is a graph used to describe the widths of JTE regions of a semiconductor device according to an embodiment of this disclosure;

FIG. 4 is a graph indicating impurity concentrations in a drift layer of a semiconductor device according to this disclosure;

FIG. 6 is a graph indicating the results of comparing a semiconductor device including two JTE regions with different impurity concentrations and a semiconductor device including three JTE regions with different impurity concentrations.

EMBODIMENTS OF THE INVENTION

Figure 1A:
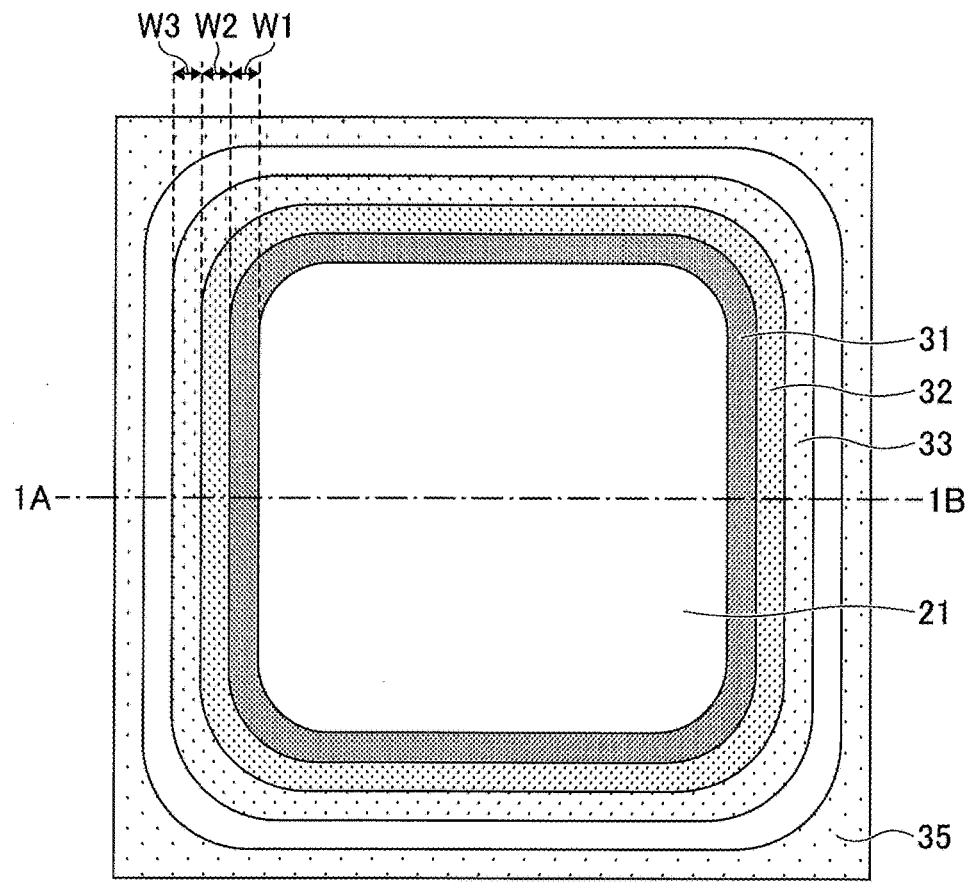
FIG. 1A is a top view of a semiconductor device according to an embodiment of this disclosure.

Problems to be Solved by this Disclosure

With a known semiconductor device configuration, it is difficult to manufacture a semiconductor device with a high withstand voltage at a low cost. Accordingly, one object of this disclosure is to provide a semiconductor device with a high withstand voltage at a low cost.

Advantageous Effect of this Disclosure

This disclosure makes it possible to provide a semiconductor device with a high withstand voltage at a low cost.

Embodiments of the present invention are described below.

DESCRIPTION OF EMBODIMENTS

First, embodiments of this disclosure are listed. In the descriptions below, the same reference number is assigned to the same or corresponding components, and repeated descriptions of those components are omitted.

[1] According to an aspect of this disclosure, a semiconductor device includes a single-crystal silicon carbide substrate of a first conductivity type, a drift layer of the first conductivity type that is formed of a silicon carbide film on one surface of the single-crystal silicon carbide substrate, one electrode that is Schottky-connected to the drift layer, a first JTE region that is formed around an active portion where the drift layer and the one electrode are Schottky-connected, a second JTE region that is formed around the first JTE region, a third JTE region that is formed around the second JTE region, and another electrode that is disposed on another surface of the single-crystal silicon carbide substrate. The first JTE region, the second JTE region, and the third JTE region are doped with an impurity of a second conductivity type different from the first conductivity type, a concentration ratio R21 represented by (concentration of the impurity in the second JTE region)/(concentration of the impurity in the first JTE region) and a concentration ratio R32 represented by (concentration of the impurity in the third JTE region)/(concentration of the impurity in the second JTE region) are greater than or equal to 0.50 and less than or equal to 0.65, and a width W1 of the first JTE region, a width W2 of the second JTE region, and a width W3 of the third JTE region are greater than or equal to 130 μm and less than or equal to 190 μm.

The inventors of the present invention have found that the yield can be improved by setting the concentration ratio R21 and the concentration ratio R32 at a value greater than or equal to 0.50 and less than or equal to 0.65, and by setting the width W1 of the first JTE region, the width W2 of the second JTE region, and the width W3 of the third JTE region at a value greater than or equal to 130 μm and less than or equal to 190 μm. Specifically, setting the above conditions makes it possible to widen the margin of the dose of the impurity that is ion-implanted into the first JTE region, the second JTE region, and the third JTE region. Widening the margin of the dose of the ion-implanted impurity makes it possible to manufacture semiconductor devices with a desired withstand voltage at high yield and thereby reduce the costs of manufacturing the semiconductor devices.

[2] The thickness of the drift layer is greater than or equal to 142.5 μm and less than or equal to 157.5 μm.

[3] The drift layer is doped with an impurity at a concentration greater than or equal to $4.0 \times 10^{14}$ cm$^{-3}$ and less than or equal to $6.0 \times 10^{14}$ cm$^{-3}$.

[4] The semiconductor device also includes a channel stopper region of the first conductivity type that is formed around the third JTE region in the drift layer. The channel stopper region is doped with an impurity that is different from an impurity with which the drift layer is doped.

DETAILS OF EMBODIMENTS

An embodiment (hereafter referred to as "present embodiment") of this disclosure is described below in detail. However, the present invention is not limited to the disclosed embodiment.
<Semiconductor Device>

Figure 1B:
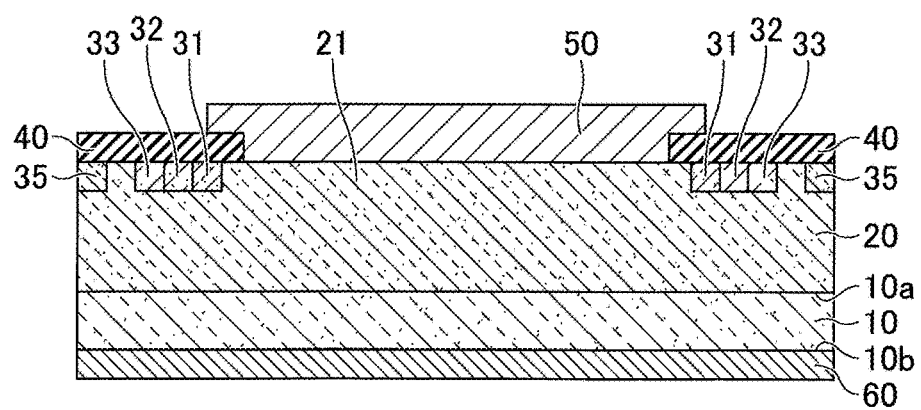
FIG. 1B is a cross-sectional view of a semiconductor device according to an embodiment of this disclosure.

A semiconductor device according to the present embodiment is described. The semiconductor device of the present embodiment is a silicon carbide semiconductor device and is a Schottky barrier diode. Specifically, as illustrated in FIG. 1, a drift layer 20 made of a silicon carbide epitaxial film is formed on one surface 10a of an n+-SiC (silicon carbide) substrate 10, which is a silicon carbide semiconductor substrate. FIG. 1A is a top view of a portion of the semiconductor device of the present embodiment which is formed of semiconductors, and FIG. 1B is a cross-sectional view of the semiconductor device of the present embodiment taken along a dashed-dotted line 1A-1B in FIG. 1A. An insulating film 40 is formed on the drift layer 20 to surround an active portion 21 through which an electric current flows. An anode electrode 50 is formed on an area of the drift layer 20 surrounded by the insulating film 40. Also, a cathode electrode 60 is formed on another surface 10b of the n+-SiC substrate 10. Accordingly, in the semiconductor device of the present embodiment, an area of the drift layer 20 on which the anode electrode 50 is formed becomes the active portion 21. The semiconductor device of the present embodiment is used, for example, for a power supply of an X-ray source or an electron gun of an electron microscope, which uses a high voltage but does not use a high current.

The drift layer 20 is formed of an n--SiC epitaxial film having a thickness of about 150 μm, and is doped with Nitrogen (N) as an n-type impurity at a concentration of about $5 \times 10^{14}$ cm$^{-3}$. A first JTE region 31, a second JTE region 32, and a third JTE region 33 are formed around the active portion 21 of the drift layer 20 and are arranged in this order from the inner side adjacent to the active portion 21 toward the outer side. A channel stopper region 35 is formed around the third JTE region 33. The insulating film 40 is formed on the first JTE region 31, the second JTE region 32, the third JTE region 33, and the channel stopper region 35.

In the semiconductor device of the present embodiment, the drift layer 20 is formed by epitaxial growth on the one surface 10a of the n+-SiC substrate 10. The drift layer 20 is doped with the n-type impurity when the drift layer 20 is formed by epitaxial growth.

Then, the first JTE region 31, the second JTE region 32, and the third JTE region 33 are formed by ion-implanting a p-type impurity into areas of the drift layer 20 where the first JTE region 31, the second JTE region 32, and the third JTE region 33 are to be formed.

Specifically, a silicon oxide film (not shown) is formed on the drift layer 20, and a resist pattern (not shown) having an opening in the area where the first JTE region 31 is to be formed is formed on the silicon oxide film. Next, a portion of the silicon oxide film on which the resist pattern is not formed is removed by, for example, dry etching to form an opening and thereby form a hard mask made of the silicon oxide film. Next, the first JTE region 31 is formed by ion-implanting a p-type impurity into a surface of the drift layer 20 exposed through the opening of the hard mask at a dose necessary to form the first JTE region 31.

Next, after removing the hard mask by, for example, wet etching, a silicon oxide film (not shown) is formed again on the drift layer 20, and a resist pattern (not shown) having an opening in an area where the first JTE region 31 and the second JTE region 32 are to be formed is formed on the formed silicon oxide film. Next, a portion of the silicon oxide film on which the resist pattern is not formed is removed by, for example, dry etching to form an opening and thereby form a hard mask made of the silicon oxide film. Next, the first JTE region 31 and the second JTE region 32 are formed by ion-implanting a p-type impurity into a surface of the drift layer 20 exposed through the opening of the hard mask at a dose necessary to form the first JTE region 31 and the second JTE region 32.

After removing the hard mask by, for example, wet etching, a silicon oxide film (not shown) is formed again on the drift layer 20, and a resist pattern (not shown) having an opening in an area where the first JTE region 31, the second JTE region 32, and the third JTE region 33 are to be formed is formed on the formed silicon oxide film. Next, a portion of the silicon oxide film on which the resist pattern is not formed is removed by, for example, dry etching to form an opening and thereby form a hard mask made of the silicon oxide film. Next, the first JTE region 31, the second JTE region 32, and the third JTE region 33 are formed by ion-implanting a p-type impurity into a surface of the drift layer 20 exposed through the opening of the hard mask at a dose necessary to form the first JTE region 31, the second JTE region 32, and the third JTE region 33. Then, the hard mask is removed by, for example, wet etching. Through the above process, the first JTE region 31, the second JTE region 32, and the third JTE region 33, which are arranged in this order from the inside toward the outside, can be formed on the surface of the drift layer 20. In this process, the first JTE region 31, the second JTE region 32, and the third JTE region are not formed separately to prevent misalignment of these regions due to misalignment of the opening formed in the hard mask. Thus, the amount of the impurity implanted into the first JTE region 31 is the sum of three implanted doses, and the amount of the impurity implanted into the second JTE region 32 is the sum of two implanted doses. The amount of the impurity implanted into the third JTE region 33 equals one implanted dose.

The channel stopper region 35 is formed by ion-implanting an n-type impurity into an area of the surface of the drift layer 20 around the third JTE region 33. Specifically, a silicon oxide film (not shown) is formed on the drift layer 20, and a resist pattern (not shown) having an opening in an area where the channel stopper region 35 is to be formed is formed on the formed silicon oxide film. Next, a portion of the silicon oxide film on which the resist pattern is not formed is removed by, for example, dry etching to form an opening and thereby form a hard mask made of the silicon oxide film. Next, the channel stopper region 35 is formed by ion-implanting an n-type impurity into a surface of the drift layer 20 exposed through the opening of the hard mask. Then, the hard mask is removed by, for example, wet etching.

The ion-implanted p-type and n-type impurities are activated by being annealed at a predetermined temperature after ion implantation.

In the present embodiment, the first JTE region 31, the second JTE region 32, and the third JTE region 33 are formed to have a depth of about 0.42 μm, and aluminum (Al) is used as the p-type impurity. In the channel stopper region 35, phosphorus (P) is ion-implanted as the n-type impurity at a dose of $1 \times 10^{14}$ cm$^{-2}$, and the concentration of P in the channel stopper region 35 is about $2.4 \times 10^{18}$ cm$^{-3}$.

(Simulations)

Next, results of device simulations performed on the semiconductor device with a configuration illustrated in FIG. 1 are described below.

(Concentration Ratios Among JTE Regions)

First, a simulation was performed about the concentrations of an impurity with which the first JTE region 31, the second JTE region 32, and the third JTE region 33 are doped. In the descriptions below, a concentration ratio R21 is represented by (concentration of impurity in the second JTE region 32)/(concentration of impurity in the first JTE region 31), and a concentration ratio R32 is represented by (concentration of impurity in the third JTE region 33)/(concentration of impurity in the second JTE region 32).

Specifically, a simulation about the relationship between the dose of the impurity in the first JTE region 31 and the withstand voltage was performed based on an assumption that the concentration ratio R21 equals the concentration ratio R32 and by changing the concentration ratio to 0.40, 0.50, 0.62, 0.65, 0.68, and 0.70. Because the first JTE region 31, the second JTE region 32, and the third JTE region 33 have the same depth, the concentration (cm$^{-3}$) of the impurity in each of these regions is proportional to the dose of the impurity (cm$^{-2}$). Therefore, for convenience, the concentration ratio of the impurity may be represented by the ratio of the dose (cm$^{-2}$) of the impurity. In this simulation, the width of each of the first JTE region 31, the second JTE region 32, and the third JTE region 33 was set at 170 μm, and the reference withstand voltage was set at 13 kV.

Figure 2:
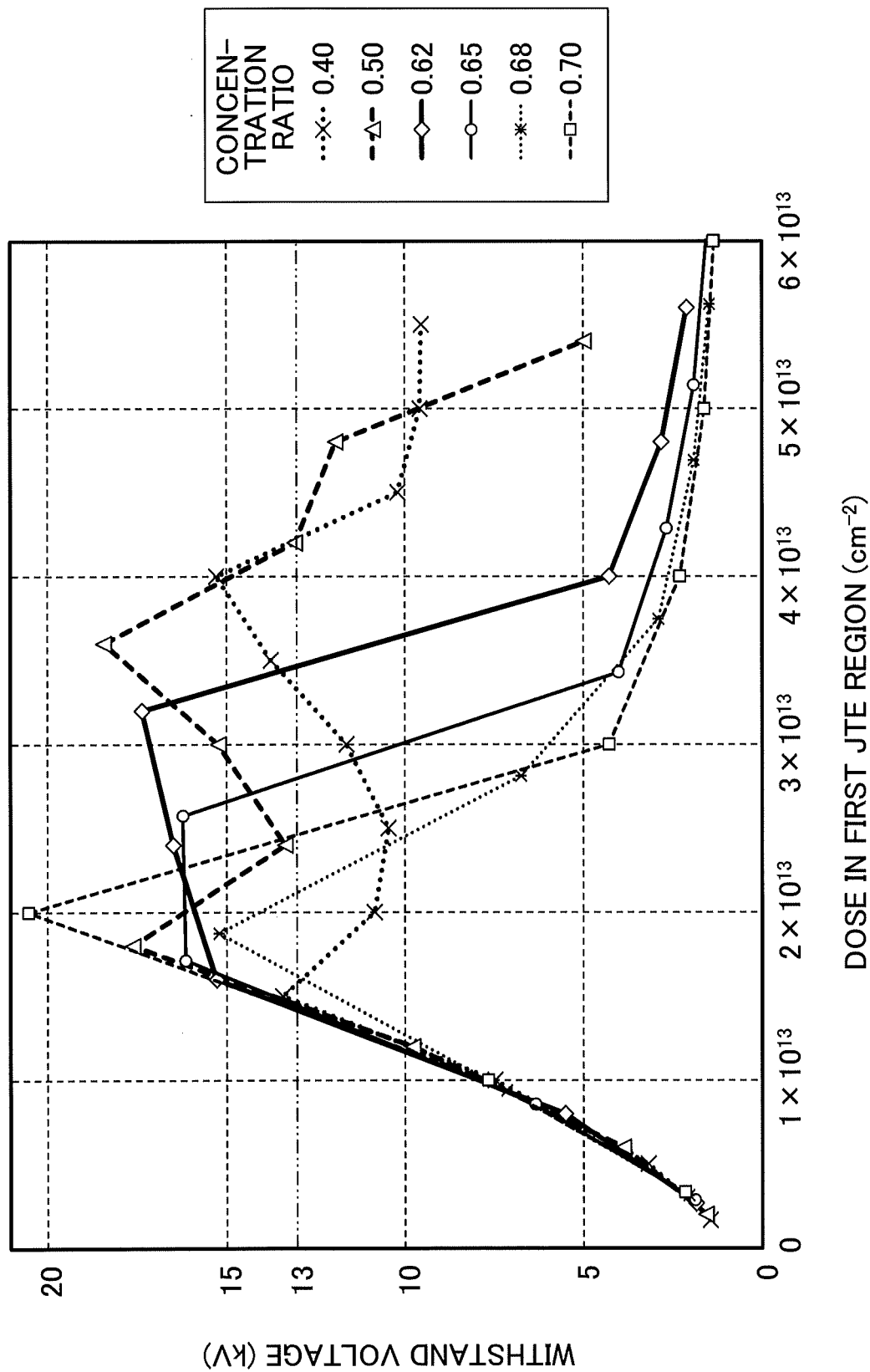
FIG. 2 is a graph indicating concentration ratios between JTE regions of a semiconductor device according to an embodiment of this disclosure.

The results are illustrated in FIG. 2. From the perspective of manufacturing semiconductor devices, increasing the margin of the dose of the impurity that can achieve a desired withstand voltage makes it possible to increase the yield and thereby reduce the manufacturing cost of semiconductor devices. Based on the experiences of the inventors, in terms of yield, the ratio of the maximum dose to the minimum dose is preferably greater than or equal to 2.0. That is, "(maximum dose−minimum dose)/minimum dose" is preferably greater than or equal to 1.0 (100% or greater).

When the concentration ratio is 0.40, the dose of the impurity in the first JTE region 31 that can achieve a withstand voltage greater than or equal to 13 kV is any value in a range around $1.5 \times 10^{13}$ cm$^{-2}$ and any value between about $3.3 \times 10^{13}$ cm$^{-2}$ and about $4.2 \times 10^{13}$ cm$^{-2}$. If the dose of the impurity in the first JTE region 31 is any value in a range around $1.5 \times 10^{13}$ cm$^{-2}$, the margin is very narrow. Also, if the dose of the impurity in the first JTE region 31 ranges between about $3.3 \times 10^{13}$ cm$^{-2}$ and about $4.2 \times 10^{13}$ cm$^{-2}$, the margin of the dose of the impurity in the first JTE region 31 is about $0.9 \times 10^{13}$ cm$^{-2}$, i.e., about 27% with reference to $3.3 \times 10^{13}$ cm$^{-2}$. Thus, the margin is also narrow and impractical.

When the concentration ratio is 0.50, the dose of the impurity in the first JTE region 31 that can achieve a withstand voltage greater than or equal to 13 kV ranges between about $1.4 \times 10^{13}$ cm$^{-2}$ and about $4.2 \times 10^{13}$ cm$^{-2}$. Accordingly, the margin of the dose of the impurity in the first JTE region 31 that can achieve a withstand voltage greater than or equal to 13 kV is about $2.8 \times 10^{13}$ cm$^{-2}$, i.e., about 200% with reference to $1.4 \times 10^{13}$ cm$^{-2}$. Thus, the margin is sufficiently wide and practical.

When the concentration ratio is 0.62, the dose of the impurity in the first JTE region 31 that can achieve a withstand voltage greater than or equal to 13 kV ranges between about $1.4 \times 10^{13}$ cm$^{-2}$ and about $3.5 \times 10^{13}$ cm$^{-2}$. Accordingly, the margin of the dose of the impurity in the first JTE region 31 that can achieve a withstand voltage greater than or equal to 13 kV is about $2.1 \times 10^{13}$ cm$^{-2}$, i.e., about 150% with reference to $1.4 \times 10^{13}$ cm$^{-2}$. Thus, the margin is sufficiently wide and practical.

When the concentration ratio is 0.65, the dose of the impurity in the first JTE region 31 that can achieve a withstand voltage greater than or equal to 13 kV ranges between about $1.4 \times 10^{13}$ cm$^{-2}$ and about $2.8 \times 10^{13}$ cm$^{-2}$. Accordingly, the margin of the dose of the impurity in the first JTE region 31 that can achieve a withstand voltage greater than or equal to 13 kV is about $1.4 \times 10^{13}$ cm$^{-2}$, i.e., about 100% with reference to $1.4 \times 10^{13}$ cm$^{-2}$. Thus, the margin is practical.

When the concentration ratio is 0.68, the dose of the impurity in the first JTE region 31 that can achieve a withstand voltage greater than or equal to 13 kV ranges between about $1.6 \times 10^{13}$ cm$^{-2}$ and about $2.1 \times 10^{13}$ cm$^{-2}$. Accordingly, the margin of the dose of the impurity in the first JTE region 31 that can achieve a withstand voltage greater than or equal to 13 kV is about $0.5 \times 10^{13}$ cm$^{-2}$, i.e., about 31% with reference to $1.6 \times 10^{13}$ cm$^{-2}$. Thus, the margin is narrow and impractical.

When the concentration ratio is 0.70, the highest withstand voltage can be achieved. In this case, the dose of the impurity in the first JTE region 31 that can achieve a withstand voltage greater than or equal to 13 kV ranges between about $1.4 \times 10^{13}$ cm$^{-2}$ and about $2.4 \times 10^{13}$ cm$^{-2}$. Accordingly, the margin of the dose of the impurity in the first JTE region 31 that can achieve a withstand voltage greater than or equal to 13 kV is about $1.0 \times 10^{13}$ cm$^{-2}$, i.e., about 71% with reference to $1.4 \times 10^{13}$ cm$^{-2}$. Thus, the margin is insufficient and impractical.

According to the above results, the production yield of semiconductor devices can be increased by setting the concentration ratios R21 and R32 at a value greater than or equal to 0.5 and less than or equal to 0.65.

(Widths of JTE Regions)

Next, a simulation was performed by changing a width W1 of the first JTE region 31, a width W2 of the second JTE region 32, and a width W3 of the third JTE region 33. Here, as illustrated in FIG. 1, the width W1 of the first JTE region 31, the width W2 of the second JTE region 32, and the width W3 of the third JTE region 33 are measured in a direction facing outward from the active portion 21.

In this simulation, the width W1 of the first JTE region 31, the width W2 of the second JTE region 32, and the width W3 of the third JTE region 33 were assumed to be the same. That is, it was assumed that W1=W2=W3. Based on this assumption, a simulation about the relationship between the dose of the impurity in the first JTE region 31 and the withstand voltage was performed by changing the widths of the JTE regions. In this simulation, the concentration ratio R21 and the concentration ratio R32 were set at 0.62, and the reference withstand voltage was set at 13 kV.

The results are illustrated in FIG. 3. When the width of the JTE regions is 110 μm, the dose of the impurity in the first JTE region 31 that can achieve a withstand voltage greater than or equal to 13 kV ranges between $1.6 \times 10^{13}$ cm$^{-2}$ and about $3.3 \times 10^{13}$ cm$^{-2}$. Accordingly, the margin of the dose of the impurity in the first JTE region 31 that can achieve a withstand voltage greater than or equal to 13 kV is about $1.7 \times 10^{13}$ cm$^{-2}$, i.e., about 110% with reference to $1.6 \times 10^{13}$ cm$^{-2}$.

In cases where the width of the JTE regions is 130 μm, 150 μm, 170 μm, 190 μm, 210 μm, 230 μm, and 250 μm, the dose of the impurity in the first JTE region 31 that can achieve a withstand voltage greater than or equal to 13 kV is substantially the same. Specifically, the lower limit is $1.4 \times 10^{13}$-$1.5 \times 10^{13}$ cm$^{-2}$, and the upper limit is $3.4 \times 10^{13}$-$3.5 \times 10^{13}$ cm$^{-2}$. Accordingly, the margin of the dose of the impurity in the first JTE region 31 that can achieve a withstand voltage greater than or equal to 13 kV is between $1.9 \times 10^{13}$ cm$^{-2}$ and $2.1 \times 10^{13}$ cm$^{-2}$, i.e., between about 127% and 140% with reference to $1.5 \times 10^{13}$ cm$^{-2}$.

As the width of the JTE regions increases to 130 μm, 150 μm, 170 μm, 190 μm, 210 μm, 230 μm, and 250 μm in this order, the withstand voltage also increases gradually. However, after the width becomes greater than or equal to 190 μm, the withstand voltage does not almost change. Because the chip size and the cost of the semiconductor device increase as the width of the JTE regions increases, the width of the JTE regions is preferably as narrow as possible. As long as the width of the JTE regions is greater than or equal to 130 μm, the margin of the dose of the impurity does not almost change. Even when the width of the JTE regions is 110 μm, the margin of the dose of the impurity is sufficiently wide. However, when the width of the JTE regions is set at a value in a range greater than or equal to 130 μm where the margin of the dose of the impurity does not almost change, semiconductor devices can be manufactured more stably.

For the above reasons, the width of the JTE regions is preferably greater than or equal to 130 μm and less than or equal to 190 μm. Even if the width of the JTE regions is changed within this range, the margin of the dose of the impurity does not almost change. Therefore, the width W1 of the first JTE region 31, the width W2 of the second JTE region 32, and the width W3 of the third JTE region 33 are preferably set at a value greater than or equal to 130 μm and less than or equal to 190 μm.

(Drift Layer)

Next, the drift layer 20 of the semiconductor device according to the present embodiment is described. In the semiconductor device of the present embodiment, the thickness of the drift layer 20 is preferably greater than or equal to 95% of 150 μm and less than or equal to 105% of 150 μm. The withstand voltage is determined by the thickness of the drift layer 20 and the concentration of the doped impurity. Therefore, in terms of the withstand voltage, the drift layer 20 is preferably as thick as possible. However, the electric current that flows through the drift layer 20 decreases as the thickness of the drift layer 20 increases. For this reason, the thickness of the drift layer 20 is preferably greater than or equal to 95% of 150 μm and less than or equal to 105% of 150 μm, i.e., greater than or equal to 142.5 μm and less than or equal to 157.5 μm.

Although the drift layer 20 is formed by epitaxial growth, the concentration of the impurity added to the drift layer 20 tends to vary. According to the findings of the inventors, even if the impurity is added to a concentration of $5.0 \times 10^{14}$ cm$^{-3}$, the actual concentration varies by about ±20% and becomes a value within a range between $4.0 \times 10^{14}$ cm$^{-3}$ and $6.0 \times 10^{14}$ cm$^{-3}$.

Next, with the semiconductor device of the present embodiment, a simulation was performed by varying the impurity concentration in the drift layer 20. Specifically, in the simulation, the concentration ratio R21 and the concentration ratio R32 were set at 0.62, and the width W1 of the first JTE region 31, the width W2 of the second JTE region 32, and the width W3 of the third JTE region 33 were set at 170 μm.

The results are illustrated in FIG. 4. As illustrated in FIG. 4, when the impurity concentration in the drift layer 20 is $5.0 \times 10_{14}$ cm$^{-3}$, the dose of the impurity in the first JTE region 31 that can achieve a withstand voltage greater than or equal to 13 kV ranges between about $1.4 \times 10^{13}$ cm$^{-2}$ and about $3.5 \times 10^{13}$ cm$^{-2}$. Accordingly, the margin of the dose of the impurity in the first JTE region 31 that can achieve a withstand voltage greater than or equal to 13 kV is about $2.1 \times 10^{13}$ cm$^{-2}$, i.e., about 150% with reference to $1.4 \times 10^{13}$ cm$^{-2}$.

When the impurity concentration in the drift layer 20 is $4.0 \times 10_{14}$ cm$^{-3}$, the dose of the impurity in the first JTE region 31 that can achieve a withstand voltage greater than or equal to 13 kV ranges between about $1.3 \times 10^{13}$ cm$^{-2}$ and about $3.2 \times 10^{13}$ cm$^{-2}$. Accordingly, the margin of the dose of the impurity in the first JTE region 31 that can achieve a withstand voltage greater than or equal to 13 kV is about $1.9 \times 10^{13}$ cm$^{-2}$, i.e., about 146% with reference to $1.3 \times 10^{13}$ cm$^{-2}$.

When the impurity concentration in the drift layer 20 is $6.0 \times 10_{14}$ cm$^{-3}$, the dose of the impurity in the first JTE region 31 that can achieve a withstand voltage greater than or equal to 13 kV ranges between about $1.7 \times 10^{13}$ cm$^{-2}$ and about $3.4 \times 10^{13}$ cm$^{-2}$. Accordingly, the margin of the dose of the impurity in the first JTE region 31 that can achieve a withstand voltage greater than or equal to 13 kV is about $1.7 \times 10^{13}$ cm$^2$, i.e., about 100% with reference to $1.7 \times 10^{13}$ cm$^{-2}$.

Thus, with the semiconductor device of the present embodiment, even if the impurity concentration in the drift layer 20 varies between $4.0 \times 10^{14}$ cm$^{-3}$ and $6.0 \times 10^{14}$ cm$^{-3}$, a desired margin of the dose of the impurity in the first JTE region 31 can be obtained.

(Relationship Between Number of JTE Regions and Withstand voltage)

Next, it is described why a semiconductor device including three JTE regions with different impurity concentrations has an advantage in terms of the withstand voltage over a semiconductor device including two JTE regions with different impurity concentrations.

Figure 5A:
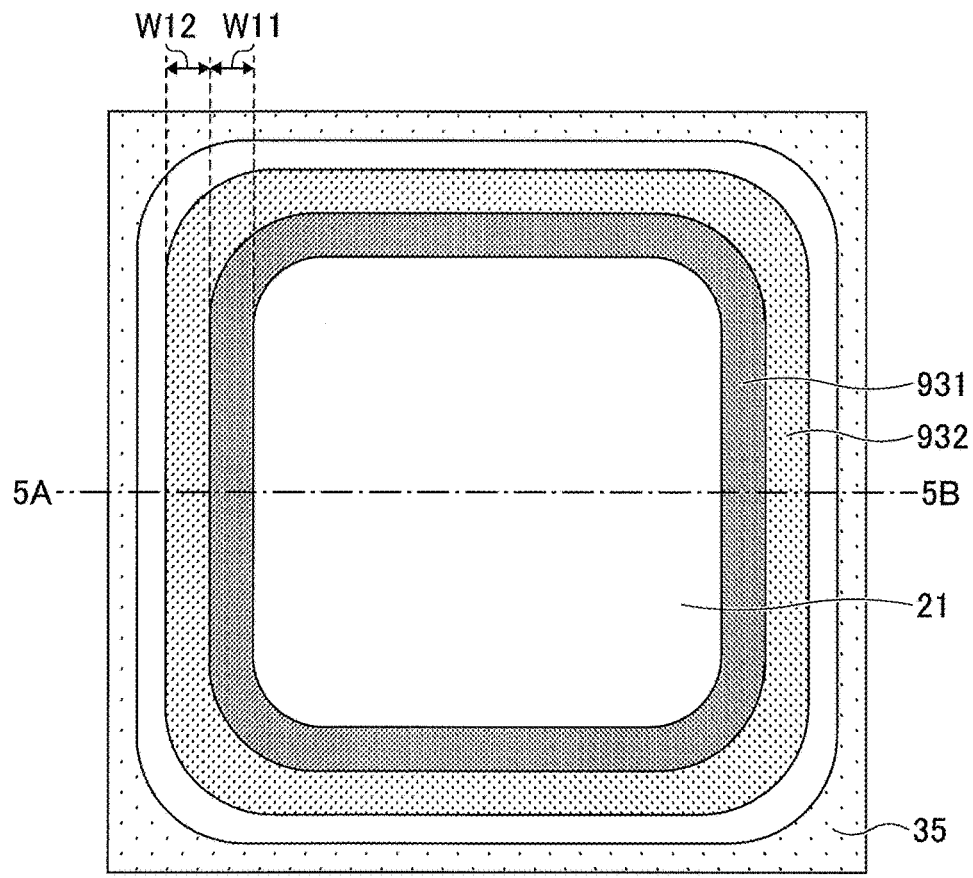
FIG. 5A is a top view of a semiconductor device used as a comparative example.
Figure 5B:
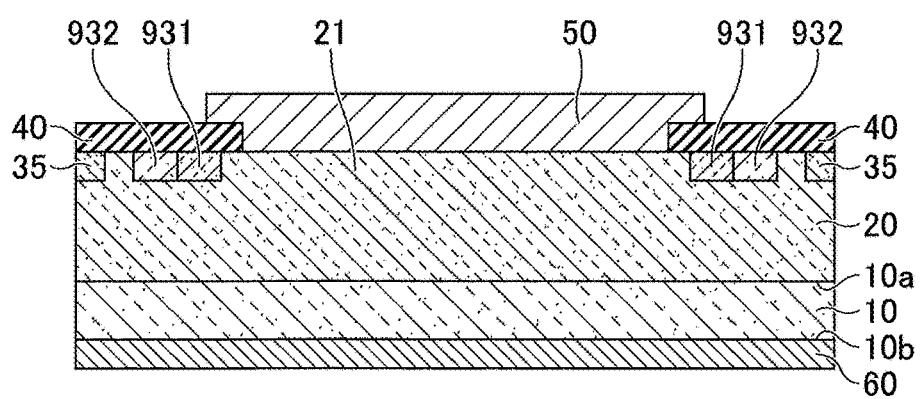
FIG. 5B is a cross-sectional view of a semiconductor device used as a comparative example.

FIG. 5 illustrates a configuration of a semiconductor device of a comparative example which includes two JTE regions with different impurity concentrations. This semiconductor device has a configuration that is substantially the same as the configuration of the semiconductor device illustrated in FIG. 1 except that two JTE regions with different impurity concentrations are provided. FIG. 5A is a top view of a portion of the semiconductor device which is formed of semiconductors, and FIG. 5B is a cross-sectional view of the semiconductor device taken along line 5A-5B in FIG. 5A. In this semiconductor device, a first JTE region 931 and a second JTE region 932 are formed around the active portion 21 of the drift layer 20 and are arranged in this order from the inner side adjacent to the active portion 21 toward the outer side.

A width W11 of the first JTE region 931 and a width W12 of the second JTE region 932 are substantially the same and are 255 μm. A concentration ratio R921 represented by "(concentration of impurity in the second JTE region 932)/(concentration of impurity in the first JTE region 931)" is 0.62. Thus, the total width of the JTE regions is 510 μm, which is the sum of the width W11 of the first JTE region 931 and the width W12 of the second JTE region 932.

In the semiconductor device of the present embodiment, the concentration ratio R21 and the concentration ratio R32 are 0.62, and each of the widths W1, W2, and W3 of the JTE regions is 170 μm. Thus, the total width of the JTE regions is 510 μm that is the sum of the width W1 of the first JTE region 31, the width W2 of the second JTE region 32, and the width W3 of the third JTE region 33. Accordingly, the total width of the two JTE regions with different impurity concentrations in the semiconductor device of FIG. 5 is the same as the total width of the three JTE regions with different impurity concentrations in the semiconductor device of the present embodiment. That is, the chip sizes of these two semiconductor devices are substantially the same.

FIG. 6 indicates the results of a simulation about the relationship between the dose of the impurity in the first JTE region 31 and the withstand voltage in these semiconductor devices.

As illustrated in FIG. 6, in the semiconductor device including two JTE regions with different impurity concentrations, the dose of the impurity in the first JTE region 931 that can achieve a withstand voltage greater than or equal to 13 kV ranges between about $1.5 \times 10^{13}$ cm$^{-2}$ and about $2.0 \times 10^{13}$ cm$^{-2}$. Accordingly, the margin of the dose of the impurity in the first JTE region 31 that can achieve a withstand voltage greater than or equal to 13 kV is about $0.5 \times 10^{13}$ cm$^{-2}$, i.e., about 33% with reference to $1.5 \times 10^{13}$ cm$^{-2}$.

On the other hand, in the semiconductor device of the present embodiment including three JTE regions with different impurity concentrations, the dose of the impurity in the first JTE region 31 that can achieve a withstand voltage greater than or equal to 13 kV ranges between about $1.4 \times 10^{13}$ cm$^{-2}$ and about $3.5 \times 10^{13}$ cm$^{-2}$. Accordingly, the margin of the dose of the impurity in the first JTE region 31 that can achieve a withstand voltage greater than or equal to 13 kV is about $2.1 \times 10^{13}$ cm$^{-2}$, i.e., about 150% with reference to $1.4 \times 10^{13}$ cm$^{-2}$. Table 1 indicates a relationship among the dose of the impurity in the first JTE region 31, the concentration of the impurity in the first JTE region 31, and the withstand voltage in the semiconductor device according to the present embodiment when the depth of the first JTE region 31 is set at 0.42 μm.

TABLE 1

| Dose of Impurity in First JTE Region (cm$^{-2}$) | Concentration of Impurity in First JTE Region (cm$^{-3}$) | Withstand Voltage (kV) |
|---|---|---|
| $2.7 \times 10^{12}$ | $6.3 \times 10^{16}$ | 1.9 |
| $8.0 \times 10^{12}$ | $1.9 \times 10^{17}$ | 5.5 |
| $1.6 \times 10^{13}$ | $3.8 \times 10^{17}$ | 15 |
| $2.4 \times 10^{13}$ | $5.7 \times 10^{17}$ | 16.5 |
| $3.2 \times 10^{13}$ | $7.6 \times 10^{17}$ | 17 |
| $4.0 \times 10^{13}$ | $9.5 \times 10^{17}$ | 4.3 |
| $4.8 \times 10^{13}$ | $1.1 \times 10^{18}$ | 2.8 |
| $5.6 \times 10^{13}$ | $1.3 \times 10^{18}$ | 2.1 |

Thus, as long as the total width of the JTE regions is the same, compared with the semiconductor device of FIG. 5 including two JTE regions with different impurity concentrations, the semiconductor device of the present embodiment including three JTE regions with different impurity concentrations can widen the margin of the dose of the impurity.

It is presumed that the margin of the dose of the impurity can be widened further by increasing the number of JTE regions with different impurity concentrations to a value greater than three, for example, to four. However, as the number of JTE regions with different impurity concentrations increases, the number of manufacturing steps increases, and the number of masks for forming resist patterns for ion implantation also increases. As a result, the costs of the semiconductor device increase. Therefore, from the viewpoint of the manufacturing costs, it is preferable to reduce the number of JTE regions with different impurity concentrations. Accordingly, setting the number of JTE regions with different concentrations at three makes it possible to obtain a desired margin of the dose of ion implantation and to reduce the costs of manufacturing semiconductor devices with a withstand voltage greater than or equal to 13 kV.

In the present embodiment, the channel stopper region 35 with a width of 30 μm is formed around the third JTE region 33, and the distance between the third JTE region 33 and the channel stopper region 35 is 190 μm. The length from the inner edge of the first JTE region 31 to the inner edge of the insulating film 40 is 2 μm. Accordingly, the width of a peripheral portion around the active portion 21 of the semiconductor device of the present embodiment is 2 μm+170 μm×3+190 μm+30 μm=732 μm. Thus, when the outside dimensions of the semiconductor device is 7 mm×7 mm, the size of the active portion 21 is approximately 5.5 mm×5.5 mm.

Figure 7:
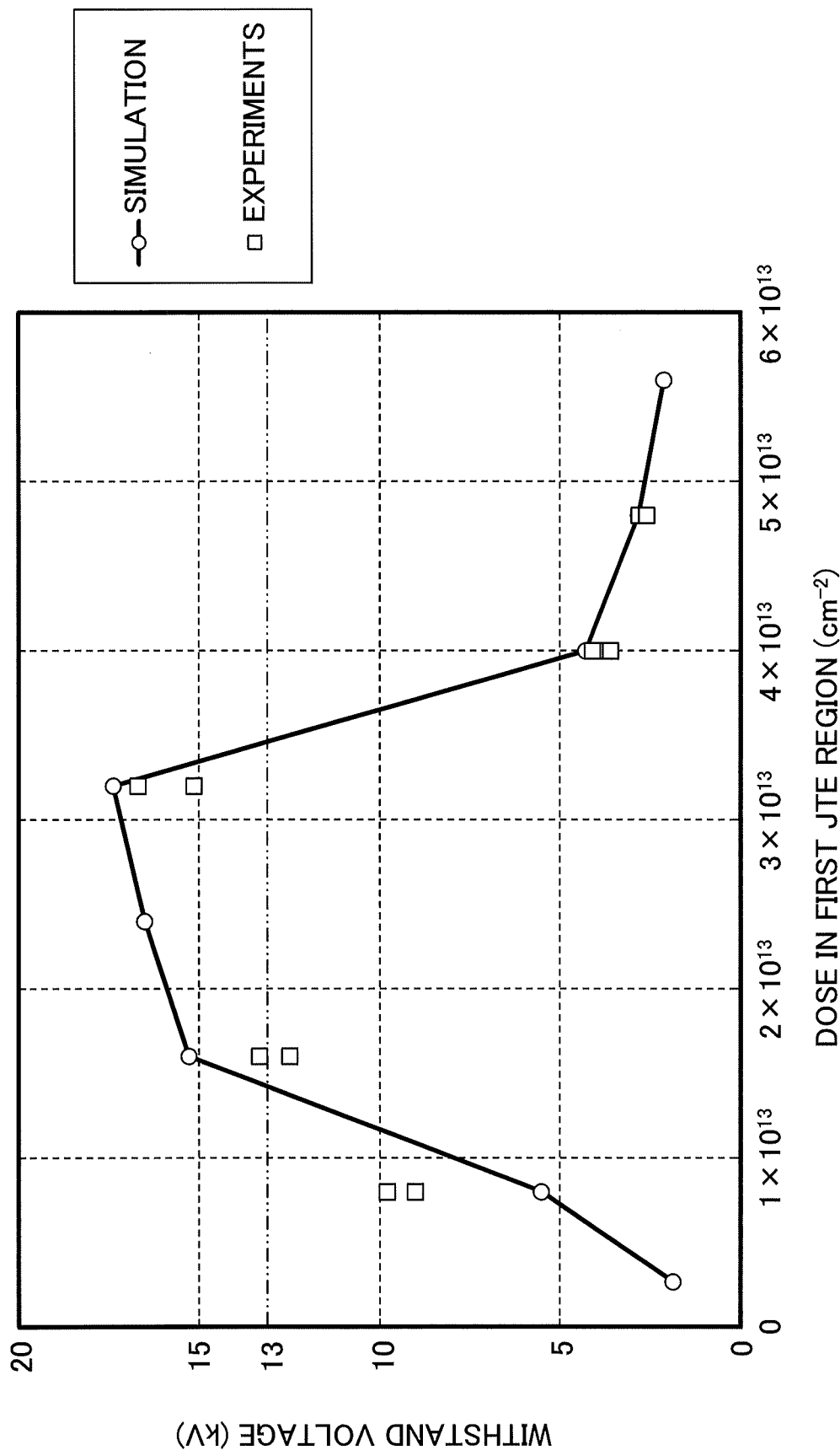
FIG. 7 is graph indicating withstand voltages of semiconductor devices actually produced according to an embodiment of this disclosure.

FIG. 7 is a graph indicating withstand voltages measured using semiconductor devices that were actually produced and are similar to the simulation model of the semiconductor device of the present embodiment. In the produced semiconductor devices, each of the concentration ratio R21 and the concentration ratio R32 is 0.62, and each of the widths W1, W2, and W3 of the JTE regions is 170 μm.

As illustrated in FIG. 7, when the dose of the impurity in the first JTE region 31 is about $8.0 \times 10^{12}$ cm$^{-2}$, the withstand voltage in the simulation is about 5.5 kV, and the withstand voltages of the actually produced semiconductor devices are about 9 kV and about 10 kV. When the dose of the impurity in the first JTE region 31 is about $1.6 \times 10^{13}$ cm$^{-2}$, the withstand voltage in the simulation is about 15 kV, and the withstand voltages of the actually produced semiconductor devices are about 12.5 kV and about 13.5 kV. When the dose of the impurity in the first JTE region 31 is about $3.2 \times 10^{13}$ cm$^{-2}$, the withstand voltage in the simulation is about 17 kV, and the withstand voltages of the actually produced semiconductor devices are about 15 kV and about 16.5 kV. When the dose of the impurity in the first JTE region 31 is about 4.0×10$^{13}$ cm$^{-2}$, the withstand voltage in the simulation is about 4.3 kV, and the withstand voltages of the actually produced semiconductor devices are about 3.5 kV and about 4.0 kV. When the dose of the impurity in the first JTE region 31 is about 4.8×10$^{13}$ cm$^{-2}$, the withstand voltage in the simulation is about 2.8 kV, and the withstand voltages of the actually produced semiconductor devices are about 2.5 kV and about 2.8 kV.

Thus, the results of the simulations performed in the present embodiment are substantially consistent with the results of measurements using the actually produced semiconductor devices.

The embodiment of the present invention is described above in detail. However, the present invention is not limited to the specifically disclosed embodiment, and variations and modifications may be made without departing from the scope of the present invention.

EXPLANATION OF REFERENCE NUMERALS 10 n+-SiC substrate
20 Drift layer
21 Active portion
31 First JTE region
32 Second JTE region
33 Third JTE region
35 Channel stopper region
40 Insulating film
50 Anode electrode
60 Cathode electrode

The invention claimed is:

1. A semiconductor device, comprising:
a single-crystal silicon carbide substrate of a first conductivity type;
a drift layer of the first conductivity type, the drift layer being formed of a silicon carbide film on one surface of the single-crystal silicon carbide substrate;
one electrode that is Schottky-connected to the drift layer;
a first junction termination extension (JTE) region that is formed around an active portion where the drift layer and the one electrode are Schottky-connected;
a second JTE region that is formed around the first JTE region;
a third JTE region that is formed around the second JTE region; and
another electrode that is disposed on another surface of the single-crystal silicon carbide substrate, wherein
the first JTE region, the second JTE region, and the third JTE region are doped with an impurity of a second conductivity type different from the first conductivity type;
the second JTE region is disposed next to the first JTE region, and the third JTE region is disposed next to the second JTE region;
a concentration ratio R21 represented by (concentration of the impurity in the second JTE region)/(concentration of the impurity in the first JTE region) and a concentration ratio R32 represented by (concentration of the impurity in the third JTE region)/(concentration of the impurity in the second JTE region) are greater than or equal to 0.50 and less than or equal to 0.65; and
a width W1 of the first JTE region, a width W2 of the second JTE region, and a width W3 of the third JTE region are greater than or equal to 130 μm and less than or equal to 190 μm.

2. The semiconductor device as claimed in claim 1, wherein a thickness of the drift layer is greater than or equal to 142.5 μm and less than or equal to 157.5 μm.

3. The semiconductor device as claimed in claim 1, wherein the drift layer is doped with an impurity at a concentration greater than or equal to 4.0×10$^{14}$ cm$^{-3}$ and less than or equal to 6.0×10$^{14}$ cm$^{-3}$.

4. The semiconductor device as claimed in claim 2, wherein the drift layer is doped with an impurity at a concentration greater than or equal to 4.0×10$^{14}$ cm$^{-3}$ and less than or equal to 6.0×10$^{14}$ cm$^{-3}$.

5. The semiconductor device as claimed in claim 1, further comprising:
a channel stopper region of the first conductivity type, the channel stopper region being formed around the third JTE region in the drift layer,
wherein the channel stopper region is doped with an impurity that is different from an impurity with which the drift layer is doped.

6. The semiconductor device as claimed in claim 2, further comprising:
a channel stopper region of the first conductivity type, the channel stopper region being formed around the third JTE region in the drift layer,
wherein the channel stopper region is doped with art impurity that is different from an impurity with which the drift layer is doped.

7. The semiconductor device as claimed in claim 3, further comprising:
a channel stopper region of the first conductivity type, the channel stopper region being formed around the third JTE region in the drift layer,
wherein the channel stopper region is doped with an impurity that is different from an impurity with which the drift layer is doped.

8. The semiconductor device as claimed in claim 4, further comprising:
a channel stopper region of the first conductivity type, the channel stopper region being formed around the third JTE region in the drift layer,
wherein the channel stopper region is doped with an impurity that is different from an impurity with which the drift layer is doped.

* * * * *